(12) United States Patent
Ko

(10) Patent No.: US 8,675,426 B2
(45) Date of Patent: Mar. 18, 2014

(54) SEMICONDUCTOR DEVICE, SEMICONDUCTOR SYSTEM HAVING THE SAME, AND COMMAND ADDRESS SETUP/HOLD TIME CONTROL METHOD THEREFOR

(75) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 30 days.

(21) Appl. No.: 13/591,156

(22) Filed: Aug. 21, 2012

(65) Prior Publication Data

US 2013/0176799 A1 Jul. 11, 2013

(30) Foreign Application Priority Data

Jan. 5, 2012 (KR) .................. 10-2012-0001714

(51) Int. Cl.
*G11C 7/00* (2006.01)
(52) U.S. Cl.
USPC ........................ 365/193; 365/233.1
(58) Field of Classification Search
USPC ........................ 365/193, 233.1, 194
See application file for complete search history.

(56) References Cited

U.S. PATENT DOCUMENTS

2012/0250433 A1* 10/2012 Jeon .............................. 365/193

FOREIGN PATENT DOCUMENTS

| KR | 100540480 B1 | 12/2005 |
| KR | 1020090032168 A | 4/2009 |

\* cited by examiner

*Primary Examiner* — Huan Hoang
(74) *Attorney, Agent, or Firm* — William Park & Associates Patent Ltd.

(57) ABSTRACT

A semiconductor system includes a controller configured to output a clock enable signal, first to third command/address signals, a chip select signal, first and second entry commands and an exit command, and receive an output signal; and a semiconductor device configured to latch the first and second command/address signals and transfer the output signal in response to the chip select signal and the first entry command, latch the first and third command/address signals and transfer the output signal in response to the chip select signal and the second entry command, and transfer data generated by the first to third command/address signals as the output signal in response to the clock enable signal and the exit command signal.

32 Claims, 8 Drawing Sheets the present application claims priority under 35 U.S.C 119
SEMICONDUCTOR DEVICE, SEMICONDUCTOR SYSTEM HAVING THE SAME, AND COMMAND ADDRESS SETUP/HOLD TIME CONTROL METHOD THEREFOR

CROSS-REFERENCES TO RELATED APPLICATIONS

The present application claims priority under 35 U.S.C 119 (a) to Korean Patent Application No. 10-2012-0001714 filed on Jan. 5, 2012 in the Korean Intellectual Property Office, which is incorporated herein by reference in its entirety.

BACKGROUND

In general, command/address signal may be applied to a semiconductor device such as a semiconductor memory device from a controller and it need to meet a setup/hold time specification. With the increase of the operating speed of the controller, various methods for the command/address signal to meet the setup/hold time specification are being researched.

By checking a delay amount of the command/address signals occurring while the controller applies the command addresses to the semiconductor device, the controller performs an operation of controlling the setup/hold times of the command/address signals (hereinafter, referred to as a 'calibration operation'). The semiconductor device latches the command/address signals and outputs the latched command/address signals through data pads, and the controller is fed back with the command addresses which are outputted through the data pads.

However, in the case where the number of the command/address signals is greater than the number of the data pads, the semiconductor device cannot output the command/address signals to the data pads. Accordingly, since the controller cannot be fed back with the command/address signals, the setup/hold times of the command addresses cannot be controlled.

SUMMARY

An embodiment of the present invention relates to a semiconductor system which divisionally latches command/address signals and thereby can control setup/hold times of command/address signals even in the case where the number of the command/address signals is greater than the number of data pads.

In an embodiment of the present invention, a semiconductor system includes: a controller configured to apply a clock enable signal, first to third command addresses, a chip select signal, first and second entry commands and an exit command, and receive an output signal; and a semiconductor device configured to latch the first and second command addresses and transfer the output signal in response to the chip select signal and the first entry command, latch the first and third command addresses and transfer the output signal in response to the chip select signal and the second entry command, and transfer data generated by the first to third command addresses as the output signal in response to the clock enable signal and the exit command signal.

In an embodiment of the present invention, a semiconductor system includes: a signal generation block configured to generate a strobe signal, first and second calibration signals and a control signal in response to an internal clock, a clock enable signal, a chip select signal, first and second entry commands and an exit command; a latch block configured to latch a first command address in response to the strobe signal and generate a first latched command address; a selective latch block configured to latch a second or third command address in response to the strobe signal and the first and second calibration signals and generate a selectively latched command address; a read path circuit configured to be inputted with the first to third command addresses and generate data; and a multiplexer configured to transfer the data or the first latched command address and the selectively latched command address as an output signal in response to the control signal.

In an embodiment of the present invention, a method for controlling setup/hold times of command addresses includes: applying first to third command addresses, a first entry command, a clock enable signal and a chip select signal to a semiconductor device by a controller; generating first and second latched command addresses which are generated by latching the first and second command addresses during a period in which the clock enable signal is disabled and the chip select signal is enabled, and transmitting the first and second latched command addresses to the controller, by the semiconductor device; applying the first to third command addresses, a second entry command, the clock enable signal and the chip select signal to the semiconductor device by the controller; generating first and third latched command addresses which are generated by latching the first and third command addresses during a period in which the clock enable signal is disabled and the chip select signal is enabled, and transmitting the first and third latched command addresses to the controller, by the semiconductor device; and controlling setup/hold times of the first to third latched command addresses by the controller.

In the semiconductor device according to the embodiments of the present invention, even in the case where the number of command addresses is greater than the number of data pads, setup/hold times of the command addresses may be controlled.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
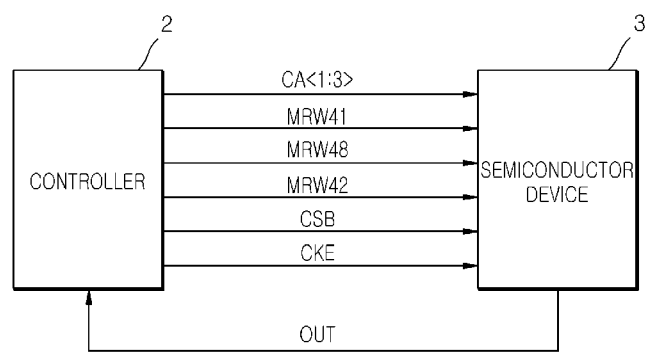
FIG. 1 is a block diagram showing the configuration of a semiconductor system in accordance with an embodiment of the present invention.

FIG. 1 is a block diagram showing the configuration of a semiconductor system in accordance with an embodiment of the present invention.

Referring to FIG. 1, the semiconductor system in accordance with an embodiment of the present invention includes a controller 2 and a semiconductor device 3. If the controller 3 applies first to third command/address signals CA<1:3>, a first entry command MRW41, a clock enable signal CKE and a chip select signal CSB to the semiconductor device 3, the semiconductor device 3 latches the first and second command/address signals CA<1> and CA<2> during a period in which the clock enable signal CKE is disabled and the chip select signal CSB is enabled, and transfers the latched first and second command/address signals CA<1> and CA<2> as an output signal OUT to the controller 2. If the controller 2 applies the first to third command/address signals CA<1:3>, a second entry command MRW48, the clock enable signal CKE and the chip select signal CSB to the semiconductor device 3, the semiconductor device 3 latches the first and third command/address signals CA<1> and CA<3> during the period in which the clock enable signal CKE is disabled and the chip select signal CSB is enabled, and transfers the latched first and third command/address signals CA<1> and CA<3> as the output signal OUT to the controller 2. The semiconductor device 3 performs a calibration operation during a period in which the semiconductor device 3 is applied with the first entry command MRW41 or the second entry command MRW48 and the clock enable signal CKE is disabled to a logic low level. The controller 2, which has received the output signal OUT, compares the setup/hold times of the first to third command/address signals CA<1:3> with a required setup/hold time, and controls the setup/hold times of the first to third command/address signals CA<1:3>.

If the controller 2 applies the first to third command/address signals CA<1:3>, an exit command MRW42 and the clock enable signal CKE to the semiconductor device 3, the semiconductor device 3 transfers data DATA generated according to the first to third command/address signals CA<1:3> during a period in which the clock enable signal CKE is enabled, as the output signal OUT. Also, the semiconductor device 3 transfers the data DATA as the output signal OUT during a period from a time when the clock enable signal CKE is enabled to a time when the first entry command MRW41 is applied and during a period from the time when the clock enable signal CKE is enabled to a time when the second entry command MRW48 is applied. The semiconductor device 3 interrupts the calibration operation during a period in which the clock enable signal CKE is enabled to a logic high level.

Figure 2:
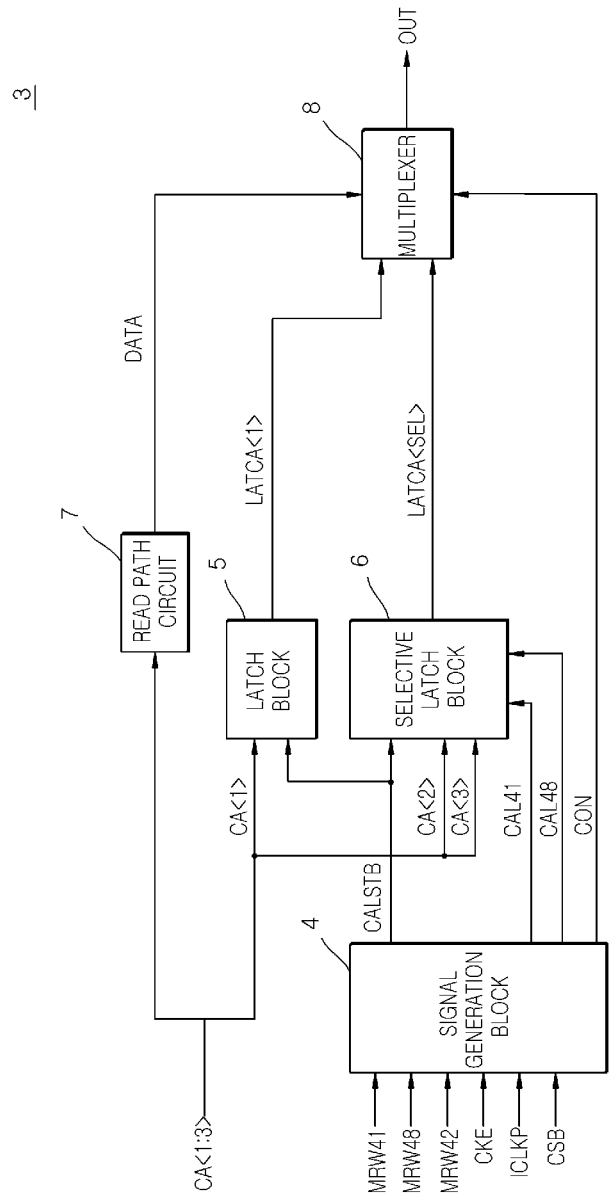
FIG. 2 is a block diagram showing the configuration of the semiconductor device included in the semiconductor system shown in FIG. 1.

Referring to FIG. 2, the semiconductor device 3 includes a signal generation block 4, a latch block 5, a selective latch block 6, a read path circuit 7, and a multiplexer 8.

The signal generation block 4 is configured to generate a first calibration signal CAL41 which is enabled to a logic high level when the signal generation block 4 is applied with the first entry command MRW41. If a second calibration signal CAL48 has been enabled to a logic high level before the signal generation block 4 is applied with the first entry command MRW41, the signal generation block 4 disables the second calibration signal CAL48. The signal generation block 4 buffers an internal clock ICLKP and generates a strobe signal CALSTB during a period in which the first calibration signal CAL41 and the chip select signal CSB are enabled. The signal generation block 4 generates a control signal CON which is enabled to a logic high level from a time when the first calibration signal CAL41 is enabled to a time when the clock enable signal CKE is enabled.

Also, the signal generation block 4 is configured to generate the second calibration signal CAL48 which is enabled to the logic high level when the signal generation block 4 is applied with the second entry command MRW48. If the first calibration signal CAL41 has been enabled to the logic high level before the signal generation block 4 is applied with the second entry command MRW48, the signal generation block 4 disables the first calibration signal CAL41. The signal generation block 4 buffers the internal clock ICLKP and generates the strobe signal CALSTB during a period in which the second calibration signal CAL48 and the chip select signal CSB are enabled. The signal generation block 4 generates the control signal CON which is enabled to the logic high level from a time when the second calibration signal CAL48 is enabled to a time when the clock enable signal CKE is enabled.

Further, the signal generation block 4 is configured to generate the first calibration signal CAL41 and the second calibration signal CAL48 which are disabled to logic low levels when the signal generation block 4 is applied with the exit command MRW42. The signal generation block 4 generates the control signal CON which is disabled to a logic low level during a period in which both the first calibration signal CAL41 and the second calibration signal CAL48 are disabled.

The latch block 5 is configured to latch the first command/address signal CA<1> in synchronization with the strobe signal CALSTB and generate a first latched command/address signal LATCA<1>.

The selective latch block 6 is configured to latch the second command/address signal CA<2> in synchronization with the strobe signal CALSTB during a period in which the first calibration signal CAL41 is enabled to the logic high level and generate a selectively latched command/address signal LATCA<SEL>. Also, the selective latch block 6 is configured to latch the third command/address signal CA<3> in synchronization with the strobe signal CALSTB during a period in which the second calibration signal CAL48 is enabled to the logic high level and generate a selectively latched command/address signal LATCA<SEL>.

The read path circuit 7 is configured to be inputted with the first to third command/address signals CA<1:3> and output the data DATA which is stored in a memory cell (not shown).

The multiplexer 8 is configured to transfer the first latched command/address signal LATCA<1> and the selectively latched command/address signal LATCA<SEL> as the output signal OUT during a period in which the control signal CON has the logic high level and transfer the data DATA as the output signal OUT during a period in which the control signal CON has the logic low level.

The first entry command MRW41, the second entry command MRW48 and the exit command MRW42 may be set through level combination of the first to third command/address signals CA<1:3> in the controller 2, or may be set in the mode register set of the semiconductor device 3. The mode register set serves to set a burst type, a burst length, a CAS latency, etc. to define a specified function in operations of a semiconductor device.

Figure 3:
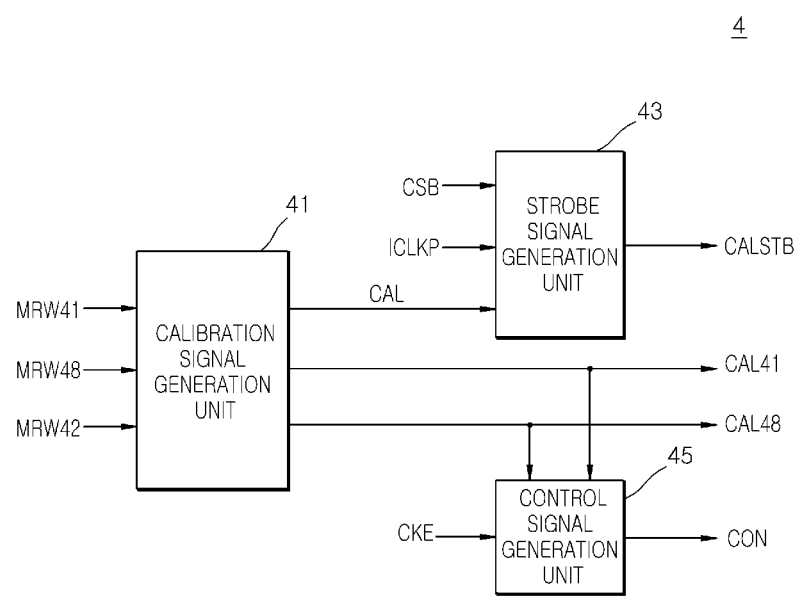
FIG. 3 is a block diagram showing the configuration of the signal generation block included in the semiconductor device shown in FIG. 2.

Referring to FIG. 3, the signal generation block 4 includes a calibration signal generation unit 41, a strobe signal generation unit 43, and a control signal generation unit 45.

The calibration signal generation unit 41 is configured to output a calibration signal CAL, and first and second calibration signals CAL41 and CAL48. The strobe signal generation unit 43 is configured to output a strobe signal CALSTB in response to the calibration signal CAL, and the control signal generation unit 45 is configured to output a control signal in response to the first and second calibration signals CAL41 and CAL48.

Figure 4:
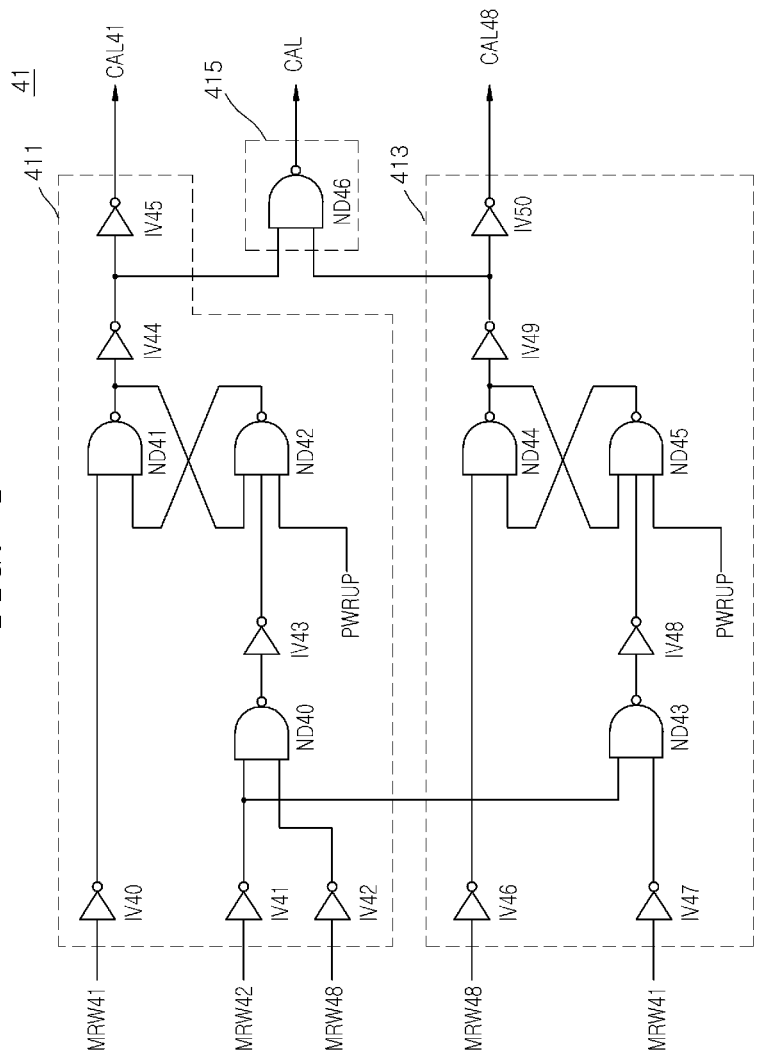
FIG. 4 is a circuit diagram showing the configuration of the calibration signal generation unit included in the signal generation block shown in FIG. 3.

Referring to FIG. 4, the calibration signal generation unit 41 includes a first calibration signal generating section 411, a second calibration signal generating section 413 and a combining section 415.

The first calibration signal generating section 411 includes a plurality of inverters IV40 to IV45 and NAND gates ND40 to ND42. The first calibration signal generating section 411 configured in this way generates the first calibration signal CAL41 which is enabled to the logic high level from a time when the first calibration signal generating section 411 is applied with the first entry command MRW41 to a time when the first calibration signal generating section 411 is applied with the second entry command MRW48 or the exit command MRW42. The first calibration signal CAL41 is disabled to the logic low level during a period in which a power-up signal PWRUP has a logic low level. The power-up signal PWRUP transitions to a logic high level when an external voltage reaches a preset level.

The second calibration signal generating section 413 includes a plurality of inverters IV46 to IV50 and NAND gates ND43 to ND45. The second calibration signal generating section 413 configured in this way generates the second calibration signal CAL48 which is enabled to the logic high level from a time when the second calibration signal generating section 413 is applied with the second entry command MRW48 to a time when the second calibration signal generating section 413 is applied with the first entry command MRW41 or the exit command MRW42. The second calibration signal CAL48 is disabled to the logic low level during a period in which the power-up signal PWRUP has the logic low level.

The combining section 415 includes a NAND gate ND46. The combining section 415 generates a calibration signal CAL which is enabled to a logic high level when the first calibration signal CAL41 or the second calibration signal CAL48 is enabled to the logic high level.

Figure 5:
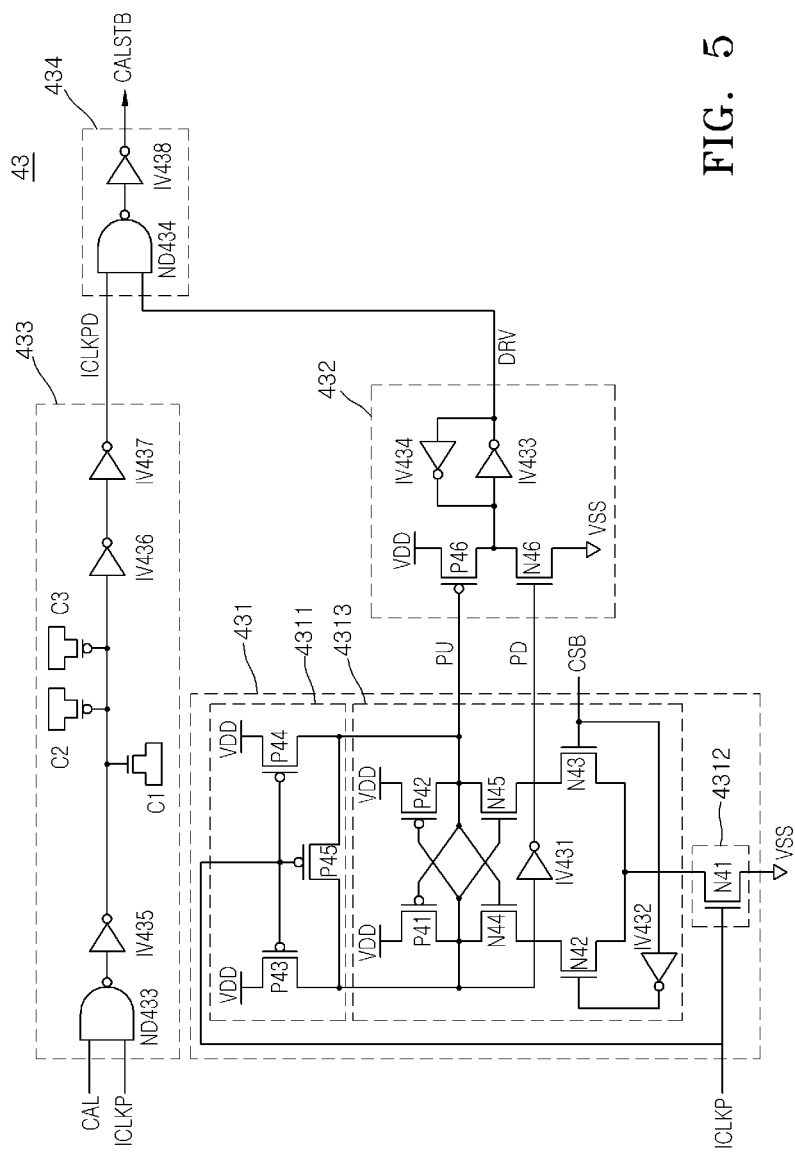
FIG. 5 is a circuit diagram showing the configuration of the strobe signal generation unit included in the signal generation block shown in FIG. 3.

Referring to FIG. 5, the strobe signal generation unit 43 includes a driving signal generating section 431, a driving latch section 432, a delay buffer section 433, and an output section 434.

The driving signal generating section 431 includes a precharge part 4311, a switching part 4312, and a cross-coupled amplification part 4313.

The precharge part 4311 includes a plurality of PMOS transistors P43 to P45, and is configured to precharge a pull-up driving signal PU and a pull-down driving signal PD with an external voltage VDD during a period in which the internal clock ICLKP has a logic low level. The switching part 4312 includes an NMOS transistor N41, and is configured to activate the cross-coupled amplification part 4313 during a period in which the internal clock ICLKP has a logic high level. The cross-coupled amplification part 4313 includes a plurality of NMOS transistors N42 to N45, a plurality of PMOS transistors P41 and P42 and a plurality of inverters IV431 and IV432. The cross-coupled amplification part 4313 configured in this way generates the pull-down driving signal PD with a logic high level during a period in which the internal clock ICLKP has the logic high level and the chip select signal CSB is enabled to a logic low level.

The driving latch section 432 includes a PMOS transistor P46, an NMOS transistor N46 and a plurality of inverters IV433 and IV434, and is configured to generate a drive signal DRV which is latched to a logic high level by the pull-down driving signal PD with the logic high level.

The delay buffer section 433 includes a NAND gate ND433, a plurality of inverters IV435 to IV437 and a plurality of capacitors C1 to C3, and is configured to buffer the internal clock ICLKP and generate a delayed internal clock ICLKPD during a period in which the calibration signal CAL is enabled to the logic high level.

The output section 434 includes a NAND gate ND434 and an inverter IV438, and is configured to buffer the delayed internal clock ICLKPD and generate the strobe signal CALSTB during a period in which the driving signal DRV is enabled to a logic high level.

The strobe signal generation unit 43 configured in this way buffers the internal clock ICLKP and generates the strobe signal CALSTB during a period in which the calibration signal CAL is enabled to the logic high level and the chip select signal CSB is enabled to the logic low level.

Figure 6:
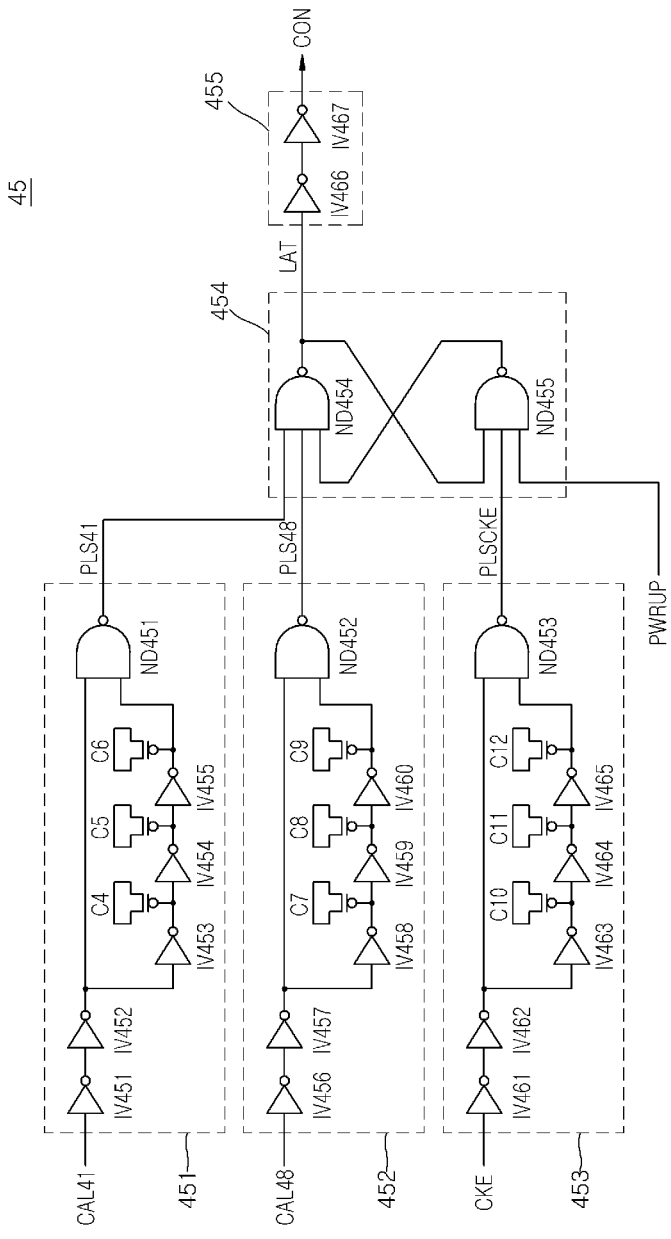
FIG. 6 is a circuit diagram showing the configuration of the control signal generation unit included in the signal generation block shown in FIG. 3.

Referring to FIG. 6, the control signal generation unit 45 includes a first pulse signal generating section 451, a second pulse signal generating section 452, a third pulse signal generating section 453, an RS latch section 454, and a buffer 455.

The first pulse signal generating section 451 includes a plurality of inverters IV451 to IV455, a plurality of capacitors C4 to C6 and a NAND gate ND451. The first pulse signal generating section 451 is configured to generate a first pulse signal PLS41 which is enabled during a period from a time point when the enabled first calibration signal CAL41 is delayed by the inverters IV451 and IV452 and the NAND gate ND451 to a time point when the enabled first calibration signal CAL41 is delayed by the inverters IV453 to IV455, the capacitors C4 to C6, and the NAND gate ND451, when the first calibration signal CAL41 is enabled to the logic high level.

The second pulse signal generating section 452 includes a plurality of inverters IV456 to IV460, a plurality of capacitors C7 to C9 and a NAND gate ND452. The second pulse signal generating section 452 is configured to generate a second pulse signal PLS48 which is enabled during a period from a time point when the enabled second calibration signal CAL48 is delayed by the inverters IV456 and IV457 and the NAND gate ND452 to a time point when the enabled second calibration signal CAL48 is delayed by the inverters IV458 to IV460, the capacitors C7 to C9, and the NAND gate ND452, when the second calibration signal CAL48 is enabled to the logic high level.

The third pulse signal generating section 453 includes a plurality of inverters IV461 to IV465, a plurality of capacitors C10 to C12 and a NAND gate ND453. The third pulse signal generating section 453 is configured to generate a third pulse signal PLSCKE which is enabled during a period from a time point when the clock enable signal CKE is delayed by the inverters IV461 and IV462 and the NAND gate ND453 to a time point when the clock enable signal CKE is delayed by the inverters IV463 to IV465, the capacitors C10 to C12, and the NAND gate ND453, when the clock enable signal CKE is enabled to the logic high level.

The RS latch section 454 includes two NAND gates ND454 and ND455, and is configured to be inputted with the first pulse signal PLS41 and the second pulse signal PLS48 as set signals and the third pulse signal PLSCKE as a reset signal and generate a latched signal LAT. The RS latch section 454 generates the latched signal LAT which is enabled to a logic high level from a time when the first pulse signal PLS41 or the second pulse signal PLS48 is generated to a time when the third pulse signal PLSCKE is generated. The latched signal LAT is disabled to a logic low level during a period in which the power-up signal PWRUP has the logic low level.

The buffer 455 includes two inverters IV466 and IV467, and is configured to buffer the latched signal LAT and generate the control signal CON.

The control signal generation unit 45 configured in this way generates the control signal CON which is enabled to the logic high level from a time when the first calibration signal CAL41 or the second calibration signal CAL48 is enabled to the logic high level to the time when the clock enable signal CKE is enabled to the logic high level.

Figure 7:
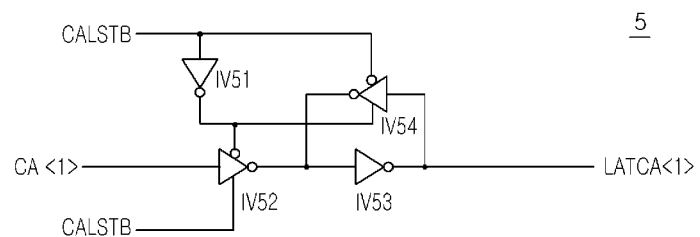
FIG. 7 is a circuit diagram showing the configuration of the latch block included in the semiconductor device shown in FIG. 2.

Referring to FIG. 7, the latch block 5 includes a plurality of inverters IV51 to IV54, and is configured to latch the first command/address signal CA<1> in synchronization with the strobe signal CALSTB and generate the first latched command/address signal LATCA<1>.

Figure 8:
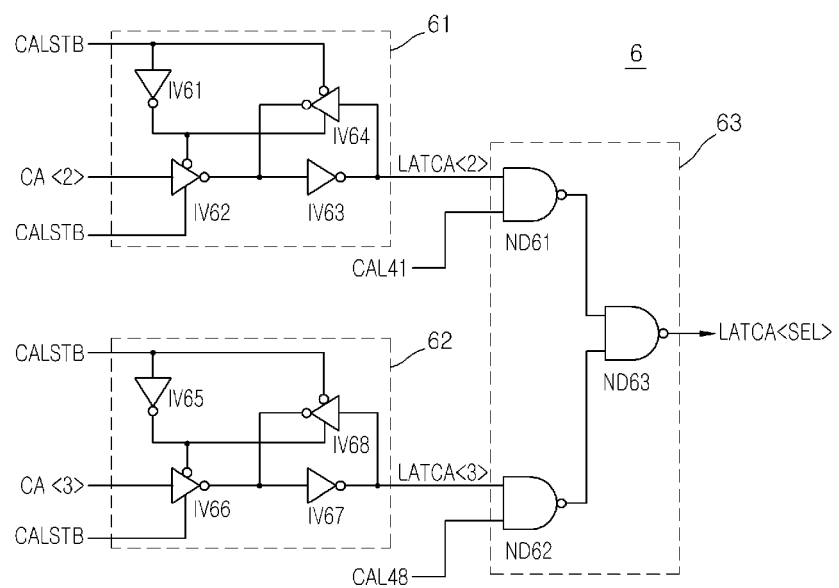
FIG. 8 is a circuit diagram showing the configuration of the selective latch block included in the semiconductor device shown in FIG. 2.

Referring to FIG. 8, the selective latch block 6 includes a first latch unit 61, a second latch unit 62, and a selective transfer unit 63.

The first latch unit 61 includes a plurality of inverters IV61 to IV64, and is configured to latch the second command/address signal CA<2> in synchronization with the strobe signal CALSTB during the period in which the first calibration signal CAL41 is enabled to the logic high level and generate the second latched command/address signal LATCA<2>.

The second latch unit 62 includes a plurality of inverters IV65 to IV68, and is configured to latch the third command/address signal CA<3> in synchronization with the strobe signal CALSTB during the period in which the second calibration signal CAL48 is enabled to the logic high level and generate the third latched command/address signal LATCA<3>.

The selective transfer unit 63 includes three NAND gates ND61 to ND63, and is configured to transfer the second latched command/address signal LATCA<2> as the selectively latched command/address signal LATCA<SEL> during the period in which the first calibration signal CAL41 is enabled to the logic high level and transfer the third latched command/address signal LATCA<3> as the selectively latched command/address signal LATCA<SEL> during the period in which the second calibration signal CAL48 is enabled to the logic high level.

Figure 9:
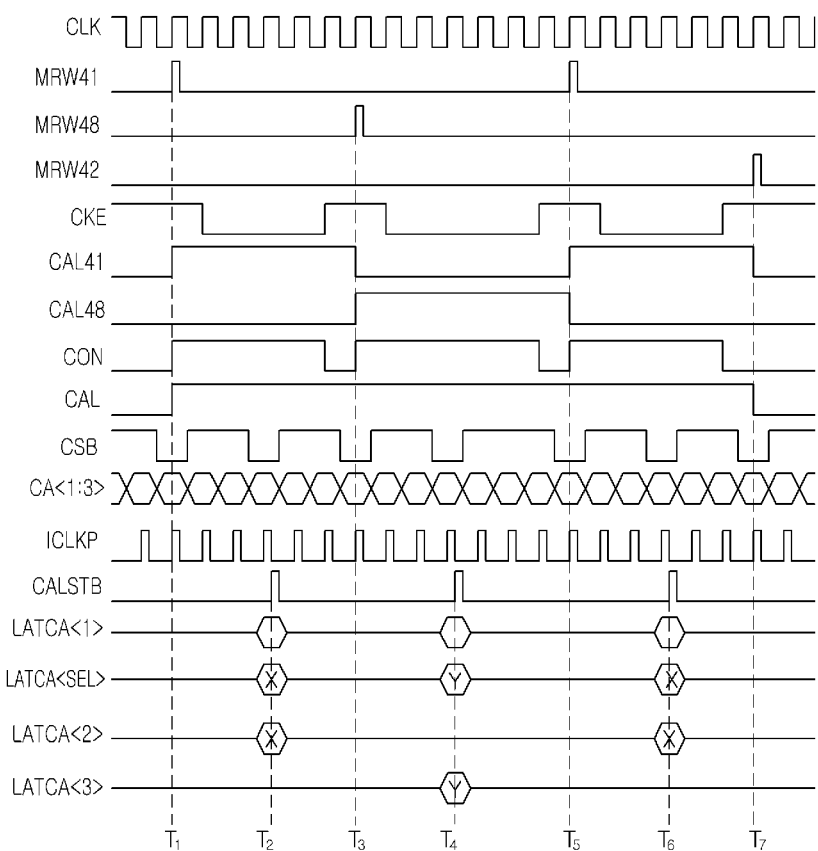
FIG. 9 is a timing diagram explaining operations of the semiconductor system in accordance with an embodiment of the present invention.

Operations performed in the semiconductor system configured as mentioned above will be described below with reference to FIG. 9.

First, at a time T1, as the controller 2 applies the first entry command MRW41 to the semiconductor device 3, the first calibration signal CAL41, the calibration signal CAL and the control signal CON are enabled to the logic high levels.

Thereafter, the clock enable signal CKE is disabled to the logic low level. In order for the semiconductor device 3 to perform the calibration operation, the clock enable signal CKE should be disabled.

At a time T2, the latch block 5 latches the first command/address signal CA<1> in synchronization with the strobe signal CALSTB and generates the first latched command/address signal LATCA<1>. The selective latch block 6 latches the second command/address signal CA<2> in synchronization with the strobe signal CALSTB and generates the second latched command/address signal LATCA<2> denoted by the reference symbol X. The multiplexer 8 transfers the first latched command/address signal LATCA<1> and the second latched command/address signal LATCA<2> denoted by the reference symbol X as the output signal OUT during a period in which the control signal CON is enabled to the logic high level. Thereafter, as the clock enable signal CKE is enabled to the logic high level, the control signal CON is disabled to the logic low level. The multiplexer 8 is inputted with the first to third command/address signals CA<1:3> and outputs the data DATA stored in the memory cell as the output signal OUT during a period in which the control signal CON is disabled to the logic low level.

Next, at a time T3, as the controller 2 applies the second entry command MRW48 to the semiconductor device 3, the second calibration signal CAL48, the calibration signal CAL and the control signal CON are enabled to the logic high levels.

Thereafter, the clock enable signal CKE is disabled to the logic low level. In order for the semiconductor device 3 to perform the calibration operation, the clock enable signal CKE should be disabled.

At a time T4, the latch block 5 latches the first command/address signal CA<1> in synchronization with the strobe signal CALSTB and generates the first latched command/address signal LATCA<1>. The selective latch block 6 latches the third command/address signal CA<3> in synchronization with the strobe signal CALSTB and generates the third latched command/address signal LATCA<3> denoted by the reference symbol Y. The multiplexer 8 transfers the first latched command/address signal LATCA<1> and the third latched command/address signal LATCA<3> denoted by the reference symbol Y as the output signal OUT during the period in which the control signal CON is enabled to the logic high level. The controller 2 is fed back with the output signal OUT, compares the setup/hold times of the first to third command/address signals CA<1:3> with a setup/hold time specification, and controls the setup/hold times of the first to third command/address signals CA<1:3>. Thereafter, as the clock enable signal CKE is enabled to the logic high level, the control signal CON is disabled to the logic low level. The multiplexer 8 is inputted with the first to third command/address signals CA<1:3> and outputs the data DATA stored in the memory cell as the output signal OUT during the period in which the control signal CON is disabled to the logic low level.

Then, at a time T5, as the controller 2 applies the first entry command MRW41 to the semiconductor device 3, the first calibration signal CAL41, the calibration signal CAL and the control signal CON are enabled to the logic high levels.

Thereafter, the clock enable signal CKE is disabled to the logic low level. In order for the semiconductor device 3 to perform the calibration operation, the clock enable signal CKE should be disabled.

At a time T6, the latch block 5 latches the first command/address signal CA<1> in synchronization with the strobe signal CALSTB and generates the first latched command/address signal LATCA<1>. The selective latch block 6 latches the second command/address signal CA<2> in synchronization with the strobe signal CALSTB and generates the second latched command/address signal LATCA<2> denoted by the reference symbol X. The multiplexer 8 transfers the first latched command/address signal LATCA<1> and the second latched command/address signal LATCA<2> denoted by the reference symbol X as the output signal OUT during the period in which the control signal CON is enabled to the logic high level. Thereafter, as the clock enable signal CKE is enabled to the logic high level, the control signal CON is disabled to the logic low level. The multiplexer 8 is inputted with the first to third command/address signals CA<1:3> and outputs the data DATA stored in the memory cell as the output signal OUT during the period in which the control signal CON is disabled to the logic low level.

At a time T7, as the controller 2 applies the exit command MRW42, the first calibration signal CAL41 and the calibration signal CAL are disabled to the logic low levels. Thereafter, as the clock enable signal CKE is enabled to the logic high level, the semiconductor device 3 interrupts the calibration operation. Since the clock enable signal CKE is enabled to the logic high level, the control signal CON is disabled to the logic low level. The multiplexer 8 is inputted with the first to third command/address signal CA<1:3> and transfers the data DATA stored in the memory cell as the output signal OUT during the period in which the control signal CON is disabled to the logic low level.

As is apparent from the above descriptions, in the semiconductor device according to an embodiment of the present invention, even in the case where the number of command/address signals is greater than the number of data pads, setup/hold times of the command/address signals may be controlled by latching the command/address signals.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor system comprising:
   a controller configured to output a clock enable signal, first to third command/address signals, a chip select signal, first and second entry commands and an exit command, and receive an output signal; and
   a semiconductor device configured to latch the first and second command/address signals and transfer the output signal in response to the chip select signal and the first entry command, latch the first and third command/address signals and transfer the output signal in response to the chip select signal and the second entry command, and transfer data generated by the first to third command/address signals as the output signal in response to the clock enable signal and the exit command signal.

2. The semiconductor system according to claim 1, wherein the controller controls setup/hold times of the first to third command/address signals by receiving the output signal which is generated by latching the first to third command/address signals.

3. The semiconductor system according to claim 1, wherein the semiconductor device latches the first and second command/address signals and transfers the output signal in response to the first entry command, and latches the first and third command/address signals and transfers the output signal in response to the second entry command, during a period in which the clock enable signal is disabled.

4. The semiconductor system according to claim 1, wherein the semiconductor device comprises:
   a signal generation block configured to generate a strobe signal, first and second calibration signals and a control signal in response to an internal clock, the clock enable signal, the chip select signal, the first and second entry commands and the exit command;
   a latch block configured to latch the first command/address signal in response to the strobe signal and generate a first latched command/address signal;
   a selective latch block configured to latch the second or third command/address signal in response to the strobe signal and the first and second calibration signals and generate a selectively latched command/address signal;
   a read path circuit configured to receive the first to third command/address signals and generate the data; and
   a multiplexer configured to transfer the data or the first latched command/address signal and the selectively latched command/address signal as the output signal in response to the control signal.

5. The semiconductor system according to claim 4, wherein the signal generation block comprises:
   a calibration signal generation unit configured to generate a calibration signal and the first and second calibration signals in response to the first and second entry commands and the exit command;
   a strobe signal generation unit configured to generate the strobe signal in response to the chip select signal, the internal clock and the calibration signal; and
   a control signal generation unit configured to generate the control signal in response to the first and second calibration signals and the clock enable signal.

6. The semiconductor system according to claim 5, wherein the calibration signal generation unit generates the first calibration signal which is enabled in response to the first entry command and is disabled in response to the second entry command or the exit command.

7. The semiconductor system according to claim 5, wherein the calibration signal generation unit generates the second calibration signal which is enabled in response to the second entry command and is disabled in response to the first entry command or the exit command.

8. The semiconductor system according to claim 5, wherein the calibration signal generation unit generates the calibration signal which is enabled when the first or second calibration signal is enabled.

9. The semiconductor system according to claim 5, wherein the calibration signal generation unit comprises:
   a first calibration signal generating section configured to generate the first calibration signal which is enabled in response to the first entry command and is disabled in response to the second entry command or the exit command; and
   a second calibration signal generating section configured to generate the second calibration signal which is enabled in response to the second entry command and is disabled in response to the first entry command or the exit command.

10. The semiconductor system according to claim 5, wherein the strobe signal generation unit generates the strobe signal by buffering the internal clock during a period in which the calibration signal and the chip select signal are enabled.

11. The semiconductor system according to claim 5, wherein the strobe signal generation unit comprises:
    a driving signal generating section configured to generate a pull-up driving signal and a pull-down driving signal in response to the chip select signal and the internal clock;
    a driving latch section configured to generate a drive signal in response to the pull-up driving signal and the pull-down driving signal;
    a delay buffer section configured to buffer the internal clock and generate a delayed internal clock during a period in which the calibration signal is enabled; and an output section configured to receive the drive signal and the delayed internal clock and generate the strobe signal.

12. The semiconductor system according to claim 11, wherein the driving signal generating section comprises:
   a switching part configured to be turned on in response to the internal clock;
   a precharge part configured to precharge the pull-up driving signal and the pull-down driving signal in response to the internal clock; and
   a cross-coupled amplification part configured to generate the pull-up driving signal and the pull-down driving signal in response to the chip select signal.

13. The semiconductor system according to claim 5, wherein the control signal generation unit generates the control signal which is enabled in response to the first or second entry command and is disabled in response to the clock enable signal.

14. The semiconductor system according to claim 5, wherein the control signal generation unit comprises:
   a first pulse signal generating section configured to generate a first pulse signal in response to the first calibration signal;
   a second pulse signal generating section configured to generate a second pulse signal in response to the second calibration signal;
   a third pulse signal generating section configured to generate a third pulse signal in response to the clock enable signal; and
   an RS latch section configured to receive the first and second pulse signals as set signals and the third pulse signal as a reset signal and generate the control signal.

15. The semiconductor system according to claim 4, wherein the selective latch block latches the second command/address signal in response to the strobe signal during a period in which the first calibration signal is enabled and transfers the selectively latched command/address signal, and latches the third command/address signal in response to the strobe signal during a period in which the second calibration signal is enabled and transfers the selectively latched command/address signal.

16. The semiconductor system according to claim 4, wherein the selective latch block comprises:
   a first latch unit configured to latch the second command/address signal in response to the strobe signal and generate a second latched command/address signal;
   a second latch unit configured to latch the third command/address signal in response to the strobe signal and generate a third latched command/address signal; and
   a selective transfer unit configured to selectively transfer the second or third command/address signal as the selectively latched command/address signal in response to the first and second calibration signals.

17. A semiconductor device comprising:
   a signal generation block configured to generate a strobe signal, first and second calibration signals and a control signal in response to an internal clock, a clock enable signal, a chip select signal, first and second entry commands and an exit command;
   a latch block configured to latch a first command/address signal in response to the strobe signal and generate a first latched command/address signal;
   a selective latch block configured to latch a second or third command/address signal in response to the strobe signal and the first and second calibration signals and generate a selectively latched command/address signal;
   a read path circuit configured to receive the first to third command/address signals and generate data; and
   a multiplexer configured to transfer the data or the first latched command/address signal and the selectively latched command/address signal as an output signal in response to the control signal.

18. The semiconductor device according to claim 17, wherein the first and second entry commands and the exit command are set by a mode register set, and
wherein the semiconductor device further comprises:
   a controller configured to receive the output signal and control setup/hold times of the first to third command/address signals.

19. The semiconductor device according to claim 18, wherein the signal generation block comprises:
   a calibration signal generation unit configured to generate a calibration signal and the first and second calibration signals in response to the first and second entry commands and the exit command;
   a strobe signal generation unit configured to generate the strobe signal in response to the chip select signal, the internal clock and the calibration signal; and
   a control signal generation unit configured to generate the controls signal in response to the first and second calibration signals and the clock enable signal.

20. The semiconductor device according to claim 19, wherein the calibration signal generation unit generates the first calibration signal which is enabled in response to the first entry command and is disabled in response to the second entry command or the exit command.

21. The semiconductor device according to claim 19, wherein the calibration signal generation unit generates the second calibration signal which is enabled in response to the second entry command and is disabled in response to the first entry command or the exit command.

22. The semiconductor device according to claim 19, wherein the calibration signal generation unit generates the calibration signal which is enabled when the first or second calibration signal is enabled.

23. The semiconductor device according to claim 19, wherein the calibration signal generation unit comprises:
   a first calibration signal generating section configured to generate the first calibration signal which is enabled in response to the first entry command and is disabled in response to the second entry command or the exit command; and
   a second calibration signal generating section configured to generate the second calibration signal which is enabled in response to the second entry command and is disabled in response to the first entry command or the exit command.

24. The semiconductor device according to claim 19, wherein the strobe signal generation unit generates the strobe signal by buffering the internal clock during a period in which the calibration signal and the chip select signal are enabled.

25. The semiconductor device according to claim 19, wherein the strobe signal generation unit comprises:
   a driving signal generating section configured to generate a pull-up driving signal and a pull-down driving signal in response to the chip select signal and the internal clock;
   a driving latch section configured to generate a drive signal in response to the pull-up driving signal and the pull-down driving signal;
   a delay buffer section configured to buffer the internal clock and generate a delayed internal clock during a period in which the calibration signal is enabled; and
   an output section configured to receive the drive signal and the delayed internal clock and generate the strobe signal.

26. The semiconductor device according to claim 25, wherein the driving signal generating section comprises:
- a switching part configured to be turned on in response to the internal clock;
- a precharge part configured to precharge the pull-up driving signal and the pull-down driving signal in response to the internal clock; and
- a cross-coupled amplification part configured to generate the pull-up driving signal and the pull-down driving signal in response to the chip select signal.

27. The semiconductor device according to claim 19, wherein the control signal generation unit generates the control signal which is enabled in response to the first or second entry command and is disabled in response to the clock enable signal.

28. The semiconductor device according to claim 19, wherein the control signal generation unit comprises:
- a first pulse signal generating section configured to generate a first pulse signal in response to the first calibration signal;
- a second pulse signal generating section configured to generate a second pulse signal in response to the second calibration signal;
- a third pulse signal generating section configured to generate a third pulse signal in response to the clock enable signal; and
- an RS latch section configured to receive the first and second pulse signals as set signals and the third pulse signal as a reset signal and generate the control signal.

29. The semiconductor device according to claim 17, wherein the selective latch block latches the second command/address signal in response to the strobe signal during a period in which the first calibration signal is enabled and transfers the selectively latched command/address signal, and latches the third command/address signal in response to the strobe signal during a period in which the second calibration signal is enabled and transfers the selectively latched command/address signal.

30. The semiconductor device according to claim 17, wherein the selective latch block comprises:
- a first latch unit configured to latch the second command/address signal in response to the strobe signal and generate a second latched command/address signal;
- a second latch unit configured to latch the third command/address signal in response to the strobe signal and generate a third latched command/address signal; and
- a selective transfer unit configured to selectively transfer the second or third command/address signal as the selectively latched command/address signal in response to the first and second calibration signals.

31. A method for controlling setup/hold times of command/address signal, comprising:
- applying first to third command/address signals, a first entry command, a clock enable signal and a chip select signal to a semiconductor device from a controller;
- generating first and second latched command/address signals which are generated by latching the first and second command/address signals during a period in which the clock enable signal is disabled and the chip select signal is enabled, and transmitting the first and second latched command/address signals to the controller from the semiconductor device;
- applying the first to third command/address signals, a second entry command, the clock enable signal and the chip select signal to the semiconductor device from the controller;
- generating first and third latched command/address signals which are generated by latching the first and third command/address signals during a period in which the clock enable signal is disabled and the chip select signal is enabled, and transmitting the first and third latched command/address signals to the controller from the semiconductor device; and
- controlling setup/hold times of the first to third latched command/address signals by the controller.

32. The method according to claim 31, wherein controlling the setup/hold times of the first to third latched command/address signals by the controller comprises:
- applying the first to third command/address signals, the exit command and the clock enable signal to the semiconductor device from the controller; and
- transmitting data generated by the first to third command/address signals during a period in which the clock enable signal is enabled, to the controller from the semiconductor device.

* * * * *